(12) United States Patent
Hung et al.

(10) Patent No.: US 9,607,923 B2
(45) Date of Patent: Mar. 28, 2017

(54) ELECTRONIC DEVICE HAVING A THERMAL CONDUCTOR MADE OF SILVER BETWEEN A HEAT SINK AND AN ELECTRONIC ELEMENT, AND FABRICATION METHOD THEREOF

(71) Applicant: Siliconware Precision Industries Co., Ltd., Taichung (TW)

(72) Inventors: Chung-Jen Hung, Taichung (TW);
Chi-An Pan, Taichung (TW);
Chi-Hsiang Hsu, Taichung (TW);
Liang-Yi Hung, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/998,048

(22) Filed: Dec. 24, 2015

(65) Prior Publication Data
US 2016/0329261 A1 Nov. 10, 2016

(30) Foreign Application Priority Data

May 5, 2015 (TW) .............................. 104114245 A
Jul. 21, 2015 (TW) .............................. 104123519 A

(51) Int. Cl.
*H01L 23/367* (2006.01)
*H01L 23/373* (2006.01)
(Continued)

(52) U.S. Cl.
CPC .......... *H01L 23/3675* (2013.01); *H01L 21/56* (2013.01); *H01L 23/3157* (2013.01); *H01L 23/3736* (2013.01); *H01L 24/27* (2013.01); *H01L 24/32* (2013.01); *H01L 24/33* (2013.01); *H01L 24/83* (2013.01); *H01L 2224/2745* (2013.01); *H01L 2224/29005* (2013.01); *H01L 2224/29082* (2013.01); *H01L 2224/29139* (2013.01); *H01L 2224/29147* (2013.01); *H01L 2224/29155* (2013.01); *H01L 2224/29166* (2013.01); *H01L 2224/32245* (2013.01);
(Continued)

(58) Field of Classification Search
CPC ............... H01L 23/367; H01L 21/4882; H01L 23/3675; H01L 23/3736; H01L 21/56; H01L 23/3157; H01L 24/33; H01L 24/83; H01L 24/27
See application file for complete search history.

(56) References Cited

U.S. PATENT DOCUMENTS

| 5,880,524 A * | 3/1999 | Xie ...................... H01L 23/427 257/704 |
| 6,734,552 B2 * | 5/2004 | Combs ................ H01L 23/4334 257/707 |

(Continued)

*Primary Examiner* — Alonzo Chambliss
(74) *Attorney, Agent, or Firm* — Mintz Levin Cohn Ferris Glovsky and Popeo, P.C.; Peter F. Corless; Steven M. Jensen

(57) ABSTRACT

An electronic device is provided, which includes an electronic element and a heat dissipating element disposed on the electronic element through a thermal conductor, wherein a width of the thermal conductor is smaller than a width of the electronic element. The thermal conductor includes silver to thereby greatly increase the thermal conductivity of the thermal conductor and hence improve the thermal conduction efficiency of the electronic device.

28 Claims, 4 Drawing Sheets

(51) Int. Cl.
*H01L 21/56* (2006.01)
*H01L 23/31* (2006.01)
*H01L 23/00* (2006.01)

(52) U.S. Cl.
CPC ............... *H01L 2924/0132* (2013.01); *H01L 2924/0133* (2013.01)

(56) References Cited

U.S. PATENT DOCUMENTS

| | | | | |
|---|---|---|---|---|
| 7,091,063 | B2* | 8/2006 | Sur | H01L 23/42 257/E23.087 |
| 7,119,432 | B2* | 10/2006 | Desai | H01L 23/3128 257/706 |
| 7,271,479 | B2* | 9/2007 | Zhao | H01L 23/055 257/704 |
| 7,535,099 | B2* | 5/2009 | Suh | H01L 23/3736 257/712 |
| 8,896,110 | B2* | 11/2014 | Hu | H01L 23/3736 257/678 |
| 2003/0080411 | A1* | 5/2003 | Baek | H01L 23/433 257/704 |
| 2005/0045855 | A1* | 3/2005 | Tonapi | C09K 5/14 252/500 |
| 2007/0158823 | A1* | 7/2007 | Dani | H01L 23/3737 257/712 |
| 2008/0274349 | A1* | 11/2008 | Chiu | H01L 23/3737 428/327 |
| 2012/0261064 | A1* | 10/2012 | Boday | H01L 23/3737 156/247 |
| 2013/0250538 | A1* | 9/2013 | Le | B23K 3/085 361/807 |

\* cited by examiner ated drawbacks, the present invention provides an electronic device having a thermal conductor made of silver between a heat sink and an electronic element, and a fabrication method thereof.

ELECTRONIC DEVICE HAVING A THERMAL CONDUCTOR MADE OF SILVER BETWEEN A HEAT SINK AND AN ELECTRONIC ELEMENT, AND FABRICATION METHOD THEREOF

CROSS-REFERENCES TO RELATED APPLICATIONS

This application claims under 35 U.S.C. §119(a) the benefit of Taiwanese Applications No. 104114245, filed May 5, 2015 and 104123519, filed Jul. 21, 2015, the entire contents of which are incorporated herein by reference.

BACKGROUND OF THE INVENTION

1. Field of the Invention

The present invention relates to electronic devices, and more particularly, to an electronic device having a heat dissipating element and a fabrication method thereof.

2. Description of Related Art

To meet demands of electronic products for improved function and processing speed, semiconductor chips that serve as core components of the electronic products are required to have high-density electronic components and electronic circuits. However, such a semiconductor chip generates a lot of heat during operation and an encapsulant that encapsulates the semiconductor chip is usually made of a material having a poor thermal conductive characteristic. For example, the material has a thermal conductivity of 0.8 W/mk. As such, the semiconductor chip has a low heat dissipating efficiency. If heat generated by the semiconductor chip cannot be dissipated effectively, the semiconductor chip may be damaged or the product reliability may be reduced.

To overcome the above-described drawback, a heat sink or heat spreader is generally provided and attached to a back side of a chip through a thermal adhesive so as to facilitate heat dissipation. However, the use of the conventional thermal adhesive cannot meet the current process requirement. Accordingly, a thermal interface material (TIM) has been developed.

In a conventional TIM process, a solder material is used as a thermal conductive material and provided between the back side of the chip and the heat sink. In addition, a gold layer is coated on the back side of the chip to strengthen the bonding between the TIM layer and the chip, and a flux is applied to facilitate the bonding of the TIM layer to the gold layer.

However, the gold coating process easily causes pollution. Further, since the gold coating process and the use of the flux complicate the fabrication process and increase the fabrication cost, they cannot meet the cost-effective requirement of wafer manufacturers or packaging firms.

Further, as the flux volatiles when exposed to heat during a reflow process of the solder material, voids are formed in the TIM layer and occupy about 40% of the volume of the TIM layer, thus reducing the thermal conductive area and decreasing the product yield.

Accordingly, another TIM process has been developed, which uses $Al_2O_3$ as a thermal conductive material.

FIG. 1 is a schematic cross-sectional view of a conventional semiconductor package structure 1 and FIG. 1' is a partially enlarged view of FIG. 1A. Referring to FIGS. 1 and 1', a semiconductor chip 11 having an active surface 11a and an inactive surface 11b opposite to the active surface 11 is provided. The active surface 11a of the semiconductor chip 11 is bonded to a packaging substrate 10 through a plurality of conductive bumps 110 and an underfill 111 is formed between the active surface 11a of the semiconductor chip 11 and the packaging substrate 10 for encapsulating the conductive bumps 10. Then, a heat dissipating element 13 made of copper is bonded to the inactive surface 11b of the semiconductor chip 11 through a TIM layer 12. The TIM layer 12 includes an aluminum oxide material 120 and a plurality of polymer particles 121. Further, the heat dissipating element 13 has a plurality of support leads 131 for supporting the heat dissipating element 13 on the packaging substrate 10 through an adhesive layer 14.

In operation, heat generated by the semiconductor chip 11 is transferred to the heat dissipating element 13 through the inactive surface 11b of the semiconductor chip 11 and the TIM layer 12 so as to be dissipated to the outside of the semiconductor package structure 1.

However, in the conventional package structure 1, compared with the heat dissipating element 13 made of copper and having a thermal conductivity of 400 W/mK, the TIM layer 12 using the aluminum oxide material 120 as a thermal conductive material has an extremely low thermal conductivity of about 3.9 W/mK, thereby hindering effective thermal conduction.

Further, the CTE (Coefficients of Thermal Expansion) of the TIM layer 12 is close to that of the semiconductor chip 11 but significantly different from that of the heat dissipating element 13, thus easily causing serious warping and delamination of an upper portion 130 of the heat dissipating element 13 from the TIM layer 12. As such, both the thermal conduction effect and the product reliability are reduced.

Therefore, how to overcome the above-described drawbacks has become critical.

SUMMARY OF THE INVENTION

In view of the above-described drawbacks, the present invention provides an electronic device, which comprises: an electronic element; a thermal conductor formed on the electronic element, wherein the thermal conductor comprises silver, and has a width smaller than a width of the electronic component; and a heat dissipating element disposed on the thermal conductor.

The present invention further provides a method for fabricating an electronic device, which comprises the steps of: providing an electronic element; and disposing a heat dissipating element on the electronic element through a thermal conductor, wherein the thermal conductor comprises silver, and has a width smaller than a width of the electronic component.

In the above-described device and method, the electronic element can be an active element, a passive element, a package element or a combination thereof.

In the above-described device and method, the thermal conductor can comprise a plurality of polymer particles having a diameter less than or equal to 20 um.

In the above-described device and method, the thermal conductor can comprise a first metal layer bonded to the electronic element, a second metal layer bonded to the heat dissipating element and a sintered silver layer sandwiched between the first metal layer and the second metal layer. For example, the first metal layer is made of Ti, Ti/Cu or Ti/Ni, Ti/Ag, Ti/Cu/Ag, or Ti/Ni/Ag, and the second metal layer is made of Ag or Ni/Ag. The first metal layer and the second metal layer can be sputtered layers. Further, both the silver layer of the first metal layer and the silver layer of the second metal layer can have a thickness greater than or equal to 200 nm.

In an embodiment, the electronic element has an active surface and an inactive surface opposite to the active surface, and the thermal conductor is disposed on a portion of the inactive surface. For example, a contact area of the thermal conductor with the inactive surface is smaller than 80% of an area of the inactive surface.

In an embodiment, the heat dissipating element has a first surface and a second surface opposite to the first surface, and the thermal conductor is disposed on a portion of the first surface or the entire first surface. For example, the thermal conductor is disposed on a portion of the first surface, and a contact area of the thermal conductor with the first surface is smaller than 80% a projection area of the first surface with respect to the inactive surface.

In an embodiment, an insulating material is further formed on the heat dissipating element and encapsulates the thermal conductor, or the thermal conductor and the electronic element.

According to the present invention, since the thermal conductor comprises silver, the thermal conductivity of the thermal conductor is greatly increased, thereby improving the thermal conduction efficiency of the electronic device.

Since the width of the thermal conductor is smaller than the width of the electronic element, the thermal conductor can be prevented from being peeled from the electronic element.

BRIEF DESCRIPTION OF DRAWINGS

FIG. 1' is a schematic partially-enlarged view of FIG. 1;

FIG. 2' is a cross-sectional view of an electronic device of an embodiment according to the present invention.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "first", "second", "on", "a" etc. are merely for illustrative purposes and should not be construed to limit the scope of the present invention.

Figure 2:
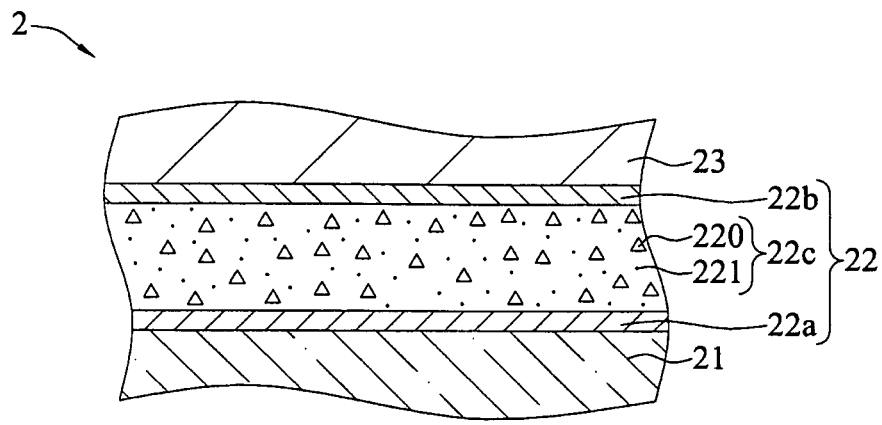
FIG. 2 is a schematic partially cross-sectional view of an electronic device according to the present invention.
Figure 2:
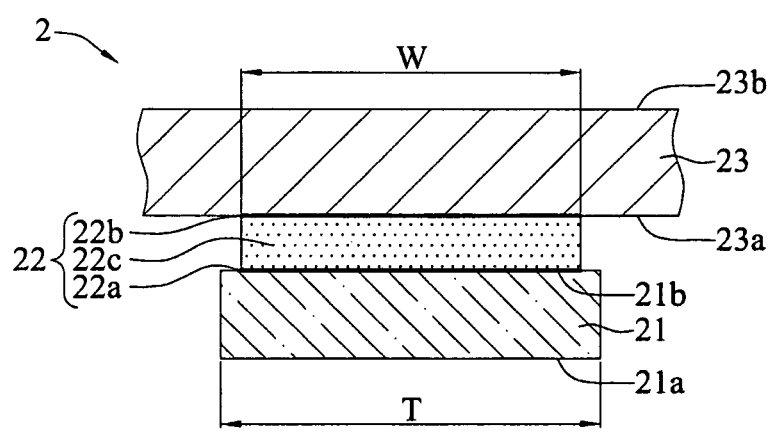

FIGS. 2 and 2' are schematic cross-sectional views showing a method for fabricating an electronic device 2 according to the present invention. Referring to FIG. 2, an electronic element 21 is provided and a heat dissipating element 23 is bonded to the electronic element 21 through a thermal conductor 22. The thermal conductor 22 includes silver, and a width W of the thermal conductor 22 is smaller than a width T of the electronic element 21.

In the present embodiment, the heat dissipating element 23 is a heat sink, for example, a copper heat sink, and has a first surface 23a and a second surface 23b opposite to the first surface 23a. The electronic element 21 can be an active element, a passive element, a package element or a combination thereof. The active element is such as a semiconductor chip. The passive element is such as a resistor, a capacitor or an inductor. The package element includes a substrate, a chip disposed on the substrate and an encapsulant encapsulating the chip. In the present embodiment, the electronic element 21 is a semiconductor chip, and has an active surface 21a and an inactive surface 21b opposite to the active surface 21a.

Figure 1:
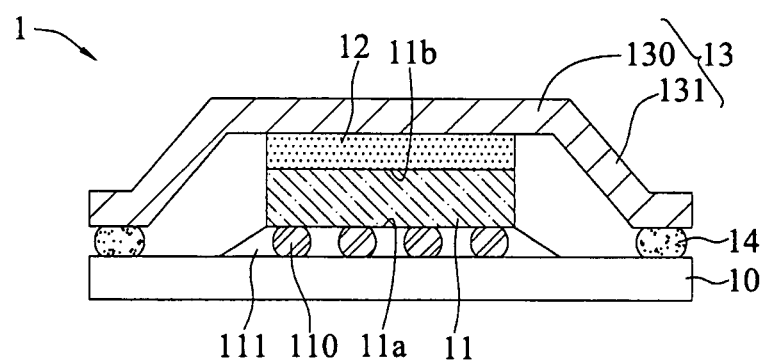
FIG. 1 is a schematic cross-sectional view of a conventional electronic device.
Figure 1:
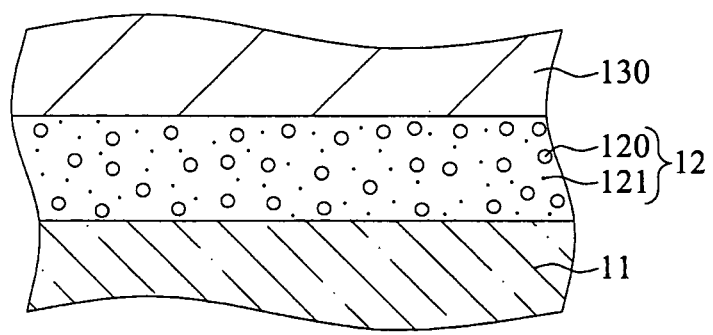

The structure of the heat dissipating element 23 is as shown in FIG. 1. However, the structure of the heat dissipating element 23 is not limited to FIG. 1, but may be varied according to the practical need.

The thermal conductor 22 has a plurality of thermal conductive layers. In particular, the thermal conductor 22 has a first metal layer 22a in direct contact with the electronic element 21, a second metal layer 22b in direct contact with the heat dissipating element 23, and a sintered silver layer 22c sandwiched between the first metal layer 22a and the second metal layer 22b.

The first metal layer 22a and the second metal layer 22b can be of multi-layer or alloy structures. Preferably, the first metal layer 22a has a multi-layer structure such as Ti, Ti/Cu or Ti/Ni, Ti/Ag, Ti/Cu/Ag or Ti/Ni/Ag. The second metal layer 22b can be made of a combination of Ti, Ag, Cu, Ni or an alloy thereof. Preferably, the second metal layer 22b is a layer of silver or has a multi-layer structure such as Ni/Ag. Preferably, the first metal layer 22a and the second metal layer 22b are formed by sputtering. For example, the second metal layer 22b can be a sputtered silver layer.

Further, the sintered silver layer 22c includes a colloid of sintered silver 220 and a plurality of polymer particles 221. The polymer particles 221 have a diameter less than or equal to 20 um. Preferably, the diameter of the polymer particles 221 is less than 20 um.

Therefore, to fabricate the electronic device 2, the first metal layer 22a is formed on the entire inactive surface 21b of the electronic element 21 by sputtering and the second metal layer 22b is formed on the first surface 23a of the heat dissipating element 23 by sputtering. Thereafter, the sintered silver layer 22c is used to connect the first metal layer 22a and the second metal layer 22b, thereby bonding the heat dissipating element 23 with the electronic element 21.

In practice, sputtered silver of the first metal layer 22a and the second metal layer 22b joins the sintered silver 220 to form metal joints. As such, portions of the sputtered silver are consumed. Therefore, to maintain the structural strength of the thermal conductor 22, the thickness of the silver layer of the first metal layer 22a and the thickness of the silver layer of the second metal layer 22b are required to be greater or equal to 200 nm. Preferably, the thickness of the silver layer of the first metal layer 22a is greater than, for example, 300 nm, and the thickness of the silver layer of the second metal layer 22b is greater than, for example, 300 nm.

Furthermore, the sintered silver layer 22c is in a colloid state. The metal nano-particle structure facilitates to reduce the reaction temperature of the metal material, and the polymer particles 221 facilitate to reduce the Young's modulus of the material. Preferably, the diameter of the polymer particles 221 is less than 20 um. Before mixing the polymer particles 221 with particles of the sintered silver 220, the sintered silver layer 22c needs to be pre-heated so as to cause the particles of the sintered silver 220 and the polymer particles 221 to be distributed uniformly, thereby resulting in a uniform stress distribution of the thermal conductor 22 and thus preventing delamination from occurring.

Figure 3A:
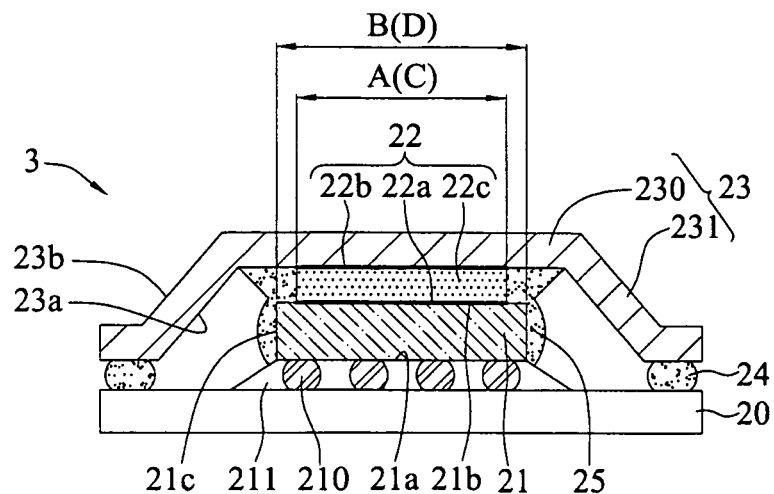
FIGS. 3A, 3A' and 3B are cross-sectional views of an electronic device of another embodiment according to the present invention.
Figure 3A:
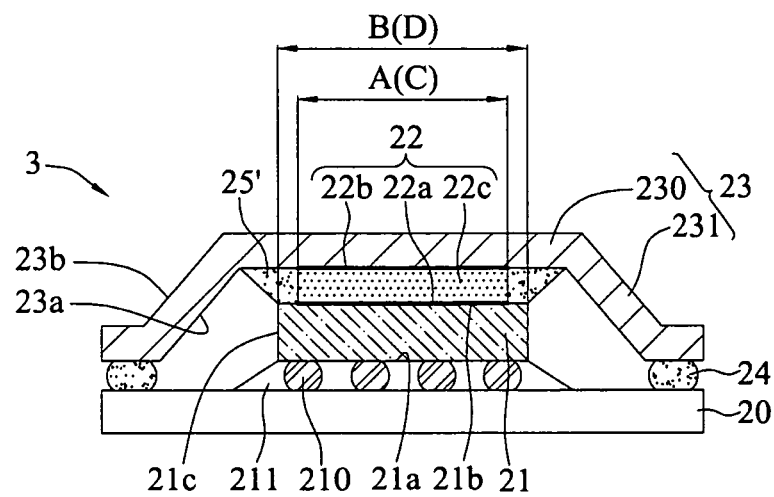
Figure 3B:
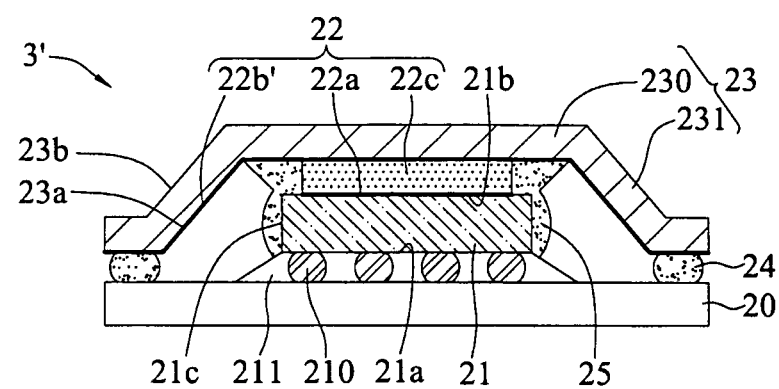

According to the method of the present invention, the width W of the thermal conductor 22 is smaller than the width T of the electronic element 21, and the thermal conductor 22 covers only a portion of the inactive surface 21b of the electronic element 21, to scatter the thermal stress between the thermal conductor 22 and the electronic element 21. Therefore, the problem that the thermal conductor 22 is peeled from the electronic element due to the difference between their coefficient of thermal expansions (CTE). FIGS. 3A and 3B show an electronic device 3, 3' of another embodiment according to the present invention. The another embodiment differs from the above embodiment in the distribution of the thermal conductor 22.

As shown in FIG. 3A, an electronic element 21 disposed on a packaging substrate 20 in a flip-chip manner with its active surface 21a disposed on the packaging substrate 20 through conductive bumps 210 and an underfill 211, and a heat dissipating element 23 is bonded to the inactive surface 21b of the electronic element 21 with its top piece 230 bonded to the inactive surface 21b through the thermal conductor 22. The heat dissipating element 23j has support leads 231 disposed on the packaging substrate 20 through an adhesive layer 24.

In an embodiment, the first metal layer 22a of the thermal conductor 22 is formed on a portion of the inactive surface 21b, and the contact area A of the thermal conductor 22 (i.e., the first metal layer 22a) with the inactive surface 21b is smaller than 80% of an area B of the inactive surface 21b (i.e., A<0.8B).

In an embodiment, the heat dissipating element 23 has a first surface 23a and a second surface 23b opposite to the first surface 23a, the second metal layer 22b of the thermal conductor 22 is formed on a portion of the first surface 23a, and the contact area C of the thermal conductor 22 (i.e., the second metal layer 22b) with the first surface 23a is smaller than a projection area D of the first surface 23a with respect to the inactive surface 21b (i.e., C<0.8D).

In an embodiment, the electronic element 3 further comprises an insulating material formed on the first surface 23a of the top piece 230 of the heat dissipating element 23, and encapsulating the thermal conductor 22 and the side surface 21c and a portion of the inactive surface 21b of the electronic element 21, in order to strengthen the bonding of the heat dissipating element 23 to the electronic element 21. Alternatively, as shown in FIG. 3A', the insulating material 25' encapsulates the thermal conductor 22, and bonding of the heat dissipating element 23 to the electronic element 21 can still be strengthened.

As shown in FIG. 3B, the second metal layer 22b' of the thermal conductor 22 can be disposed on the entire first surface 23a (i.e., the entire lower surface of the top piece 230 and the entire lower surface of the support leads 231).

In an embodiment, the first metal layer 22a is deposited on a portion of the inactive surface 21b, and the insulating material 25 is formed on the thermal conductor 22 and the side surface 21c of the electronic element 21. Therefore, the first metal layer 22a is prevented from being peeled from the inactive surface 21b, and the bonding strength of the heat dissipating element 23 to the insulating material 25 is improved.

According to the present invention, the thermal conductor 22 includes silver, especially sintered silver 220. Therefore, the thermal conductivity of the thermal conductor 22 is greatly increased. For example, the thermal conductivity of the thermal conductor 22 is about 40 W/mK. Consequently, the thermal conduction efficiency of the electronic device 2 is effectively improved.

Further, since the first metal layer 22a and the second metal layer 22b are formed by sputtering and strongly bonded to the electronic element 21 and the heat dissipating element 23 with the sputtered silver joining the sintered silver 220, the invention prevents delamination from occurring between the thermal conductor 22 and the heat dissipating element 23, thereby improving the thermal conduction effect and increasing the product reliability.

Since the width W of the thermal conductor 22 is smaller than the width T of the electronic element 21, the thermal conductor 22 can be prevented from being peeled from the electronic element 21.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. An electronic device, comprising:
an electronic element;
a thermal conductor formed on the electronic element and having a width smaller than a width of the electronic element; and
a heat dissipating element disposed on the thermal conductor,
wherein the thermal conductor comprises a first metal layer bonded to the electronic element, a second metal layer bonded to the heat dissipating element, and a sintered silver layer having a plurality of polymer particles sandwiched between the first metal layer and the second metal layer.

2. The electronic device of claim 1, wherein the electronic element is an active element, a passive element, a package element or a combination thereof.

3. The electronic device of claim 1, wherein the thermal conductor comprises a plurality of polymer particles having a diameter less than or equal to 20 um.

4. The electronic device of claim 1, wherein the first metal layer is made of Ti, Ti/Cu or Ti/Ni, Ti/Ag, Ti/Cu/Ag, or Ti/Ni/Ag.

5. The electronic device of claim 4, wherein the silver layer of the first metal layer has a thickness greater than or equal to 200 nm.

6. The electronic device of claim 1, wherein the second metal layer is made of Ag or Ni/Ag.

7. The electronic device of claim 6, wherein the silver layer of the second metal layer has a thickness greater than or equal to 200 nm.

8. The electronic device of claim 1, wherein the first metal layer is a sputtered layer.

9. The electronic device of claim 1, wherein the second metal layer is a sputtered layer.

10. The electronic device of claim 1, wherein the electronic element has an active surface and an inactive surface opposite to the active surface, and the thermal conductor is disposed on a portion of the inactive surface.

11. The electronic device of claim 10, wherein a contact area of the thermal conductor with the inactive surface is smaller than 80% of an area of the inactive surface.

12. The electronic device of claim 10, the heat dissipating element has a first surface and a second surface opposite to the first surface, and the thermal conductor is disposed on a portion of the first surface or the entire first surface.

13. The electronic device of claim 12, wherein the thermal conductor is disposed on a portion of the first surface, and a contact area of the thermal conductor with the first surface is smaller than 80% of a projection area of the first surface with respect to the inactive surface.

14. The electronic device of claim 1, further comprising an insulating material formed on the heat dissipating element and encapsulating the thermal conductor, or the thermal conductor and the electronic element.

15. A method for fabricating an electronic device, comprising the steps of:
providing an electronic element; and
disposing a heat dissipating element on the electronic element through a thermal conductor, wherein the thermal conductor has a width smaller than a width of the electronic element and comprises a first metal layer bonded to the electronic element, a second metal layer bonded to the heat dissipating element, and a sintered silver layer having a plurality of polymer particles sandwiched between the first metal layer and the second metal layer.

16. The method of claim 15, wherein the electronic element is an active element, a passive element, a package element or a combination thereof.

17. The method of claim 15, wherein the thermal conductor comprises a plurality of polymer particles having a diameter less than or equal to 20 um.

18. The method of claim 15, wherein the first metal layer is made of Ti, Ti/Cu or Ti/Ni, Ti/Ag, Ti/Cu/Ag, or Ti/Ni/Ag.

19. The method of claim 18, wherein the silver layer of the first metal layer has a thickness greater than or equal to 200 nm.

20. The method of claim 15, wherein the second metal layer is made of Ag or Ni/Ag.

21. The method of claim 20, wherein the silver layer of the second metal layer has a thickness greater than or equal to 200 nm.

22. The method of claim 15, wherein the first metal layer is a sputtered layer.

23. The method of claim 15, wherein the second metal layer is a sputtered layer.

24. The method of claim 15, wherein the electronic element has an active surface and an inactive surface opposite to the active surface, and the thermal conductor is disposed on a portion of the inactive surface.

25. The method of claim 24, wherein a contact area of the thermal conductor with the inactive surface is smaller than 80% of an area of the inactive surface.

26. The method of claim 24, wherein the heat dissipating element has a first surface and a second surface opposite to the first surface, and the thermal conductor is disposed on a portion of the first surface or the entire first surface.

27. The method of claim 26, wherein the thermal conductor is disposed on a portion of the first surface, and a contact area of the thermal conductor with the first surface is smaller than 80% of a projection area of the first surface with respect to the inactive surface.

28. The method of claim 15, further comprising an insulating material formed on the heat dissipating element and encapsulating the thermal conductor, or the thermal conductor and the electronic element.

* * * * *